(12) United States Patent
Taira et al.

(10) Patent No.: US 9,384,888 B2
(45) Date of Patent: Jul. 5, 2016

(54) TRANSPARENT POLYCRYSTALLINE MATERIAL AND PRODUCTION PROCESS FOR THE SAME

(71) Applicants: INTER-UNIVERSITY RESEARCH INSTITUTE CORPORATION, NATIONAL INSTITUTES OF NATURAL SCIENCES, Tokyo (JP); GENESIS RESEARCH INSTITUTE, INCORPORATED, Aichi (JP)

(72) Inventors: Takunori Taira, Aichi (JP); Jun Akiyama, Aichi (JP); Shigeo Asai, Aichi (JP); Kunihiko Hara, Aichi (JP)

(73) Assignees: INTER-UNIVERSITY RESEARCH INSTITUTE CORPORATION, NATIONAL INSTITUTES OF NATURAL SCIENCES, Tokyo (JP); GENESIS RESEARCH INSTITUTE, INCORPORATED, Aichi (JP)

( * ) Notice: Subject to any disclaimer, the term of this patent is extended or adjusted under 35 U.S.C. 154(b) by 239 days.

(21) Appl. No.: 13/901,268

(22) Filed: May 23, 2013

(65) Prior Publication Data

US 2013/0292882 A1   Nov. 7, 2013

Related U.S. Application Data

(62) Division of application No. 13/142,132, filed on Jun. 24, 2011, now Pat. No. 8,470,724.

(30) Foreign Application Priority Data

Dec. 25, 2008   (JP) .................................. 2008-329934

(51) Int. Cl.
*B29C 39/00* (2006.01)
*C04B 35/00* (2006.01)
(Continued)

(52) U.S. Cl.
CPC .............. *H01F 41/0253* (2013.01); *B28B 1/00* (2013.01); *C04B 35/447* (2013.01); *C04B 35/50* (2013.01);
(Continued)

(58) Field of Classification Search
CPC .... B28B 1/26; C04B 35/6455; C04B 35/447; C04B 35/495; C04B 2235/9653; C04B 2235/3244; C04B 2235/6027; C04B 2235/605; C04B 30/04
See application file for complete search history.

(56) References Cited

U.S. PATENT DOCUMENTS

2009/0067077 A1* 3/2009 Sasame et al. ................. 359/894
2009/0108507 A1* 4/2009 Messing et al. ................ 264/605

FOREIGN PATENT DOCUMENTS

| JP | 08-245259 | 9/1996 |
|---|---|---|
| JP | 09-087012 | 3/1997 |

(Continued)

OTHER PUBLICATIONS

JP 2002-193672 A (Suzuki et al) Jul. 10, 2002 (English language machine translation of document cited on IDS dated Nov. 15, 2013). [online] [retrieved Mar. 12, 2015]. Retrieved from: Japan Patent Office Advanced Industrial Property Network.*

(Continued)

*Primary Examiner* — Erin Snelting
(74) *Attorney, Agent, or Firm* — IP & T Group LLP

(57) ABSTRACT

Upon producing a transparent polycrystalline material, a suspension liquid (or slurry 1) is prepared, the suspension liquid being made by dispersing a raw-material powder in a solution, the raw-material powder including optically anisotropic single-crystalline particles to which a rare-earth element is added. A formed body is obtained from the suspension liquid by means of carrying out slip casting in a space with a magnetic field applied. On this occasion, while doing a temperature control so that the single-crystalline particles demonstrate predetermined magnetic anisotropy, one of static magnetic fields and rotary magnetic fields is selected in compliance with a direction of an axis of easy magnetization in the single-crystalline particles, and is then applied to them. A transparent polycrystalline material is obtained by sintering the formed body, the transparent polycrystalline material having a polycrystalline structure whose crystal orientation is controlled.

10 Claims, 5 Drawing Sheets

(51) Int. Cl.
- C04B 35/447 (2006.01)
- C04B 35/495 (2006.01)
- C04B 35/50 (2006.01)
- B28B 1/26 (2006.01)
- H01F 41/02 (2006.01)
- B28B 1/00 (2006.01)
- C30B 28/00 (2006.01)
- C30B 29/22 (2006.01)
- C30B 29/30 (2006.01)
- C30B 30/04 (2006.01)
- C04B 35/645 (2006.01)
- H01S 3/16 (2006.01)

(52) U.S. Cl.
CPC ............ *C04B 35/6455* (2013.01); *C30B 28/00* (2013.01); *C30B 29/22* (2013.01); *C30B 29/30* (2013.01); *C30B 30/04* (2013.01); *H01S 3/1685* (2013.01); *C04B 2235/3224* (2013.01); *C04B 2235/605* (2013.01); *C04B 2235/6027* (2013.01); *C04B 2235/9653* (2013.01); *H01S 3/1603* (2013.01); *H01S 3/1611* (2013.01); *H01S 3/1618* (2013.01); *H01S 3/1671* (2013.01); *H01S 3/1673* (2013.01)

(56) References Cited

FOREIGN PATENT DOCUMENTS

| | | |
|---|---|---|
| JP | 2001-172421 | 6/2001 |
| JP | 2002-193672 | 7/2002 |
| JP | 2002-293609 | 10/2002 |
| JP | 2003-112974 | 4/2003 |
| JP | 2003-267800 | 9/2003 |
| JP | 2004-315313 | 11/2004 |
| JP | 2005-336023 | 12/2005 |
| JP | 2008-037064 | 2/2008 |

OTHER PUBLICATIONS ("Electromagnet". [online] [retrieved Dec. 17, 2008]. Retrieved from the Internet: http://en.wikipedia.org/wiki/Electromagnet via http://archive.org/web/.*

Official Communication pursuant to Article 94(3) EPC issued by the European Patent Office on Sep. 9, 2014.

Notification of Reasons for Refusal issued by the Japanese Patent Office on Oct. 1, 2013.

He, J. L., et al., 4-ps passively mode-locked Nd: Gd 0.5 Y 0.5 VO 4 laser with a semiconductor saturable-absorber mirror, Optics letters, 2004, pp. 2803-2805, vol. 29, No. 23.

Ikesue, A., Present of solid-state lasers and expectance for ceramics technology, Materials Integration, 1999, pp. 49-56, vol. 12, No. 4.

Inoue, K., et al., Crystal Orientation of Hydroxyapatite by Imposition of a High Magnetic Field, Current Advances in Materials and Processes—The Iron and Steel Institute of Japan, 2002, pp. 226, vol. 15.

Akiyama, J., et al., Formation of c-Axis Aligned Polycrystal Hydroxyapatite Using a High Magnetic Field with Mechanical Sample Rotation, Journal of the Japan Institute of Metals, 2006, pp. 412-414, vol. 70, No. 5.

Suzuki, T. S., et al., Orientation amplification of alumina by colloidal filtration in a strong magnetic field and sintering, Advanced Engineering Materials, 2001, pp. 490-492, vol. 3, No. 7.

Decision to Grant a Patent issued by the Japanese Patent Office on Feb. 17, 2015.

Suzuki, T. S., et al., Control of Texture in ZnO by Slip Casting in a Strong Magnetic Field and Heating, Chemistry Letters, Sep. 3, 2002, pp. 1204-1205, vol. 31.

Suzuki, T. S., et al., Control of texture in alumina by colloidal processing in a strong magnetic field, Science and Technology of Advanced Materials, May 5, 2006, pp. 356-364, vol. 7.

* cited by examiner

Evaluation on Degree of Orientation
by means of X-ray Diffraction
(A) 4% Yb:FAP Ceramic
(B) 4% Nd:FAP Ceramic
(C) FAP Powder
(D) PDF 00-015-0876

TRANSPARENT POLYCRYSTALLINE MATERIAL AND PRODUCTION PROCESS FOR THE SAME

This application is a divisional of U.S. patent application Ser. No. 13/142,132 filed on Jun. 24, 2011, which is a national stage application of PCT/JP2009/007279 filed on Dec. 25, 2009 and claims priority of Japanese patent application number 2008-329934 filed on Dec. 25, 2008. The disclosure of each of the foregoing applications is incorporated herein by reference in its entirety.

TECHNICAL FIELD

The present invention relates to a transparent polycrystalline material, and to a production process for the same. A transparent polycrystalline material that is directed to the present invention can be utilized suitably for optical materials that have been used for laser apparatuses, optical measurements, devices for optical communication, and the like, for instance.

BACKGROUND ART

Recently, ceramic lasers that use polycrystalline materials as laser media have been attracting attention. For example, the laser medium in the ceramic lasers is produced by sintering a raw-material powder in a vacuum after press forming the raw-material powder into a predetermined configuration (See Patent Literature No. 1, and Non-patent Literature No. 1, for instance).

For the laser medium in these ceramic lasers, materials that are isotropic optically have been used. And, as for an optically isotropic material, YAG polycrystalline bodies that have a cubic-system crystalline structure have been used mainly. These cubic-system YAG polycrystalline bodies, one of the optically isotropic materials, exhibit an identical refractive index with respect to all directions. Consequently, they function effectively as the laser medium in the same manner as YAG single-crystalline bodies do.

Moreover, cubic-system polycrystalline bodies, such as $Y_2O_3$ and $Sc_2O_3$, have been used for the laser medium, in addition to the YAG.

In this way, as for the laser medium in the conventional ceramic lasers, the cubic-system polycrystalline bodies have been studied and developed solely to arrive at being put into practical use. This is because of the following: Since the polycrystalline bodies are constituted of a large number of microscopic single-crystalline particles, it is only possible to make polycrystalline bodies alone that scatter lights so greatly that they are unsuitable for the laser medium even when ordinarily forming and then sintering optically anisotropic single-crystalline particles that have a crystal-orientation dependency in the refractive index.

Meanwhile, apatite-system crystals (e.g., FAP, SFAP, SVAP, etc.), vanadate-system crystals (e.g., $YVO_4$, etc.), and the like, are useful as gain media, because they can enhance the oscillation efficiency in solid-state laser. However, the apatite-system crystals belong to the hexagonal system, and the vanadate-system crystals moreover belong to the tetragonal system. That is, the apatite-system crystals, vanadate-system crystals (e.g., $YVO_4$, etc.), and so forth, are materials that are anisotropic optically. Consequently, although these optically anisotropic materials are useful extremely as gain media, single-crystalline materials have come to be selected inevitably in a case of being used as the laser medium.

However, although the single-crystalline materials are produced by means of single crystal growth such as the Czochralski process, it has problems in the processing because it takes time for the growth in this single crystal growth, in addition to having strict limitations on the size and configuration of makeable samples.

In contrast to this, when it becomes feasible to make anisotropic media by means of sintering, one of the methods for making polycrystalline material, it is possible to greatly contribute to furthermore expanding laser technologies, because it becomes easier relatively to make large-size vanadate media or large-size apatite media that are unmakeable with the single crystals, although they have been needed in order for the realization of high power laser.

Patent Literature No. 1: Japanese Unexamined Patent Publication (KOKAI) Gazette No. 5-235,462; and Non-patent Literature No. 1: Annu. Rev. Mater. Res. 2006.36: pp. 397-429, "Progress in Ceramic Laser," Akio Ikesue, Yan Lin Aung, Takunori Taira, Tomosumi Kamimura, Kunio Yoshida, and Gary L. Messing

DISCLOSURE OF THE INVENTION

Assignment to be Solved by the Invention

The present invention is one which has been done in view of the aforementioned circumstances; and it is an object to provide a transparent polycrystalline material comprising a polycrystalline body that has transparency, polycrystalline body which is obtainable by forming and then sintering single-crystalline particles that are anisotropic optically.

Means for Solving the Assignment (1) A transparent polycrystalline material according to the present invention is characterized in that:

it comprises a transparent polycrystalline body being obtained by forming and then sintering a plurality of single-crystalline particles that include a rare-earth element, and which are anisotropic optically; and it has a polycrystalline structure in which crystal directions of the respective single-crystalline particles are aligned uniaxially.

(2) In the transparent polycrystalline material according to the present invention, said single-crystal particles can preferably comprise an apatite-system compound, or a vanadate-system compound.

(3) In the transparent polycrystalline material according to the present invention, said apatite-system compound can preferably be fluoroapatite, hydroxyapatite or vanadate apatite that is expressed by a chemical formula, $\alpha_5 (\beta O_4)_3 \gamma_2$ ($\alpha$: Ca or Sr, $\beta$: P or V, and $\gamma$: OH or F).

(4) In the transparent polycrystalline material according to the present invention, said vanadate-system compound can preferably be one member that is selected from the group consisting of yttrium orthovanadate that is expressed by a chemical formula, $YVO_4$; gadolinium orthovanadate that is expressed by a chemical formula, $GdVO_4$; and lutetium orthovanadate that is expressed by a chemical formula, $LuVO_4$.

(5) In the transparent polycrystalline material according to the present invention, said rare-earth element can preferably be at least one member that is selected from the group consisting of cerium (Ce), praseodymium (Pr), neodymium (Nd), promethium (Pm), samarium (Sm), terbium (Tb), dysprosium (Dy), holmium (Ho), erbium (Er), thulium (Tm), and ytterbium (Yb).

(6) The transparent polycrystalline material according to the present invention can preferably be used for optical materials.

(7) A production process for transparent polycrystalline material according to the present invention is characterized in that:

it is equipped with:

a preparation step of preparing a suspension liquid by dispersing a raw-material powder in a solution, the raw-material powder including single-crystalline particles to which a rare-earth element is added and which are anisotropic optically;

a forming step of obtaining a formed body from said suspension liquid by means of carrying out slip casting in a space with a magnetic field applied; and a calcination step of obtaining a transparent polycrystalline material by sintering said formed body, the transparent polycrystalline material comprising a transparent polycrystalline body that has a polycrystalline structure whose crystal orientation is controlled;

at said forming step, one of static magnetic fields and rotary magnetic fields is selected in compliance with a direction of an axis of easy magnetization in said single-crystalline particles, and is then applied to said single-crystalline particles while doing a temperature control so that they demonstrate predetermined magnetic anisotropy; and at said calcination step, a primary sintering step of obtaining a primarily-sintered body by primarily sintering said formed body at a temperature of 1,600-1,900 K, and a secondary sintering step of hot-isotropic-press sintering the primarily sintered body at a temperature of 1,600-1,900 K are executed in this order.

It is more preferable that the heating temperature at the primary sintering step can be 1,700-1,900 K, and that the heating temperature at the secondary sintering step can be 1,700-1,900 K.

(8) In the production process for transparent polycrystalline material according to the present invention, said single-crystalline particles can preferably comprise an apatite-system compound, or a vanadate-system compound.

In the production process for transparent polycrystalline material according to the present invention, said rare-earth element can preferably be at least one member that is selected from the group consisting of cerium (Ce), praseodymium (Pr), neodymium (Nd), promethium (Pm), samarium (Sm), terbium (Tb), dysprosium (Dy), holmium (Ho), erbium (Er), thulium (Tm), and ytterbium (Yb).

(9) In the production process for transparent polycrystalline material according to the present invention, a static magnetic field can preferably be applied at said forming step in a case where the axis of easy magnetization is the c axis in said single-crystalline particles.

(10) In the production process for transparent polycrystalline material according to the present invention a rotary magnetic field can preferably be applied vertically to the rotary axis at said forming step in a case where the axis of easy magnetization is the a axis in said single-crystalline particles.

(11) In the production process for transparent polycrystalline material according to the present invention, a static magnetic field can preferably be applied at said forming step; in a case where said single-crystalline particles comprise an apatite-system compound, and said rare-earth element is at least one member that is selected from the group consisting of cerium (Ce), praseodymium (Pr), neodymium (Nd), terbium (Tb), dysprosium (Dy), and holmium (Ho); or in a case where said single-crystalline particles comprise a vanadate-system compound, and said rare-earth element is at least one member that is selected from the group consisting of promethium (Pm), samarium (Sm), erbium (Er), thulium (Tm), and ytterbium (Yb).

(12) In the production process for transparent polycrystalline material according to the present invention a rotary magnetic field can preferably be applied at said forming step; in a case where said single-crystalline particles comprise an apatite-system compound, and said rare-earth element is at least one member that is selected from the group consisting of promethium (Pm), samarium (Sm), erbium (Er), thulium (Tm), and ytterbium (Yb); or in a case where said single-crystalline particles comprise a vanadate-system compound, and said rare-earth element is at least one member that is selected from the group consisting of cerium (Ce), praseodymium (Pr), neodymium (Nd), terbium (Tb), dysprosium (Dy), and holmium (Ho).

(13) In the production process for transparent polycrystalline material according to the present invention, said apatite-system compound can preferably be fluoroapatite, hydroxyapatite or vanadate apatite that is expressed by a chemical formula, $\alpha_5(\beta O_4)_3\gamma_2$ ($\alpha$: Ca or Sr, $\beta$: P or V, and $\gamma$: OH or F).

(14) In the production process for transparent polycrystalline material according to the present invention, said vanadate-system compound can preferably be at least one member that is selected from the group consisting of yttrium orthovanadate that is expressed by a chemical formula, $YVO_4$; gadolinium orthovanadate that is expressed by a chemical formula, $GdVO_4$; and lutetium orthovanadate that is expressed by a chemical formula, $LuVO_4$.

(15) In the production process for transparent polycrystalline material according to the present invention an intensity of the magnetic field being applied at said forming step can preferably be 1 T (tesla) or more; and a temperature control can preferably be done at said forming step so that crystal temperatures of said single-crystalline particle become 300 K or less.

Effect of the Invention

A transparent polycrystalline material according to the present invention comprises a polycrystalline body that is obtained by forming and then sintering single-crystalline particles that are anisotropic optically, and the crystal directions of the respective single-crystalline particles constituting its polycrystalline structure are aligned uniaxially. Consequently, when this transparent polycrystalline material is utilized for laser medium serving as an optical material, for instance, it becomes feasible to turn material having large stimulated-emission cross-sectional into ceramic, and hence it is possible to readily make large-size media that are capable of oscillating lasers with higher outputs in a shorter period of time.

EXPLANATION ON REFERENCE NUMERALS

Figure 1:
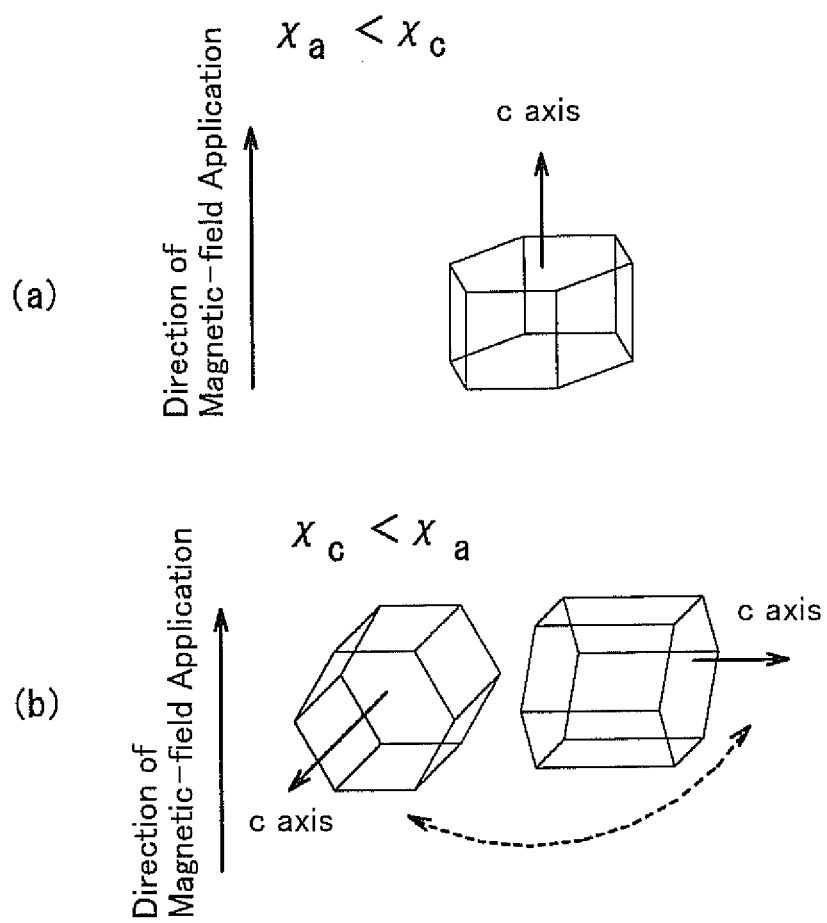
FIG. 1 is a diagram for explaining the magnetic anisotropy of single-crystalline particles to which a rare-earth element is added in a production process for transparent polycrystalline material according to some of the present embodiment modes.

1: Slurry (or Suspension Liquid);
2: Mold Made of Gypsum; and
3: Electromagnet

BEST MODE FOR CARRYING OUT THE INVENTION

Hereinafter, the embodiment modes of a transparent polycrystalline material according to the present invention and a production process for the same will be explained in detail. Note that the transparent polycrystalline material according to the present invention and the production process for the same are not those which are limited to the embodiment modes to be explained below, and so they can be conducted in various modes to which modifications and improvements are performed, modification, improvements, and the like, which one of ordinary skill in the art can carry out, within a range not departing from the scope of the present invention.

A production process for transparent polycrystalline material according to one of the present embodiment modes is equipped with a preparation step, a forming step, and a calcination step.

At the preparation step, a raw-material powder, which includes single-crystalline particles to which a rare-earth element is added and that are anisotropic optically, is dispersed in a solution, thereby preparing a suspension liquid.

Here, the "single-crystalline particles that are anisotropic optically" are those of single-crystalline particles whose refractive indices change depending on the crystal orientations, that is, those of single-crystalline particles that have crystal-orientation dependency in the refractive indices. As for the single-crystalline particles that are anisotropic optically, it is possible to name those which have any one of crystalline structures that are hexagonal, trigonal and tetragonal.

As the single-crystalline particles that have a hexagonal crystalline structure, it is possible to preferably name single-crystalline particles comprising an apatite-system compound, single-crystalline particles comprising an alumina-system compound, and the like. Moreover, as the single-crystalline particles that have a tetragonal crystalline structure, it is possible to preferably name single-crystalline particles comprising a vanadate-system compound, single-crystalline particles comprising an yttrium lithium fluoride-system compound, and so forth.

As for the single-crystalline particles that comprise a hexagonal-type apatite-system compound, it is possible to name fluoroapatite, hydroxyapatite or vanadate apatite that is expressed by a chemical formula, $\alpha_5(\beta O_4)_3\gamma_2$ ($\alpha$: Ca or Sr, $\beta$: P or V, and $\gamma$: OH or F), for instance.

As for the single-crystalline particles that comprise a tetragonal-type vanadate-system compound, it is possible to name yttrium orthovanadate that is expressed by a chemical formula, $YVO_4$; gadolinium orthovanadate that is expressed by a chemical formula, $GdVO_4$; and lutetium orthovanadate that is expressed by a chemical formula, $LuVO_4$, for instance.

A rare-earth element demonstrates inherent magnetic characteristics inherently because of the contribution of 4 f electrons that are shielded by means of the outer-shell electrons. Consequently, by means of adding a rare-earth element to the single-crystalline particles that are anisotropic optically, controlling the crystal orientations becomes feasible, controlling in which the magnetic anisotropy being induced by means of the rare-earth ions within the crystal works as a driving force.

As for the rare-earth element to be added to the single-crystalline particles that are anisotropic optically, it is possible to name cerium (Ce), praseodymium (Pr), neodymium (Nd), promethium (Pm), samarium (Sm), terbium (Tb), dysprosium (Dy), holmium (Ho), erbium (Er), thulium (Tm), and ytterbium (Yb), for instance. It is even allowable that one member of these rare-earth elements can be included in the respective single-crystalline particles independently, or it is also permissible that plural members of the rare-earth elements can be included in the respective single-crystalline particles. Moreover, it is preferable that, even among these rare-earth elements, at least one of Nd and Yb, namely, one of the representative elements to be doped into solid-state lasers in particular, can be included in the single-crystalline particles. Note that, in gadolinium (Gd) and lutetium (Lu), the crystal axis and the direction of magnetization do not correspond one another because they show a value of orbital angular momentum that is zero in the ground state and hence they have a spin angular momentum alone. Hence, adding Gd and Lu independently does not produce any effect of enhancement that is induced by the magnetic anisotropy.

The preparation method for the single-crystalline particles in which a rare-earth element is added is not limited in particular, and so it is advisable to uniformly disperse the rare-earth element in a predetermined oxide powder by means of solid-phase reactions by preliminary mixing and temporary burning, or by means of wet synthesizing methods, for instance.

And, it is possible to prepare a suspension liquid by adding a raw-material powder, which comprises a mixed powder of an oxide powder serving as the single-crystalline particles to which a rare-earth element is added and another predetermined oxide powder, to water (i.e., a solvent) and a polymer-system dispersion agent, for instance. Note that there are not any limitations on the types of the solvent and dispersion agent as well as on the added concentration of the dispersion agent, and so it is possible to arbitrarily select them in compliance with the states of raw-material powders. Upon making this suspension liquid ready, it is even advisable to use the oxide powder serving as the single-crystalline particles to which a rare-earth element is added in a plurality of species.

At the forming step, a formed body is obtained from said suspension liquid by means of carrying out slip casting in a space with a magnetic field applied.

The method of slip casting on this occasion is not limited especially, and so it is advisable to pour said suspension liquid into a porous container made of gypsum and then doing drying and forming after doing dehydration in the direction of gravitational force, for instance.

At the forming step in the production process according to the present embodiment mode, this slip casting is carried out in a magnetic-field space. Although the strength of a magnetic field being applied on this occasion can be set up arbitrarily in compliance with the magnitude of the magnetic anisotropy in the single-crystalline particles to which a rare-earth element is added, it can desirably be 1 T (i.e., tesla) or more, and can especially desirably be 1.4 T approximately. This is because, when being a magnetic field with a strength of 1.4 T approximately, it is possible to readily generate homogenous magnetic fields by means of universal electromagnetic devices in a range that has 180-mm diameter and 70-mm gap approximately, and thereby it becomes feasible to readily produce transparent polycrystalline materials with large diameters. Moreover, it is advisable that, due to the restrictions in devices for generating magnetic field, the upper limit of the strength of a magnetic field being applied in the present embodiment mode can be 15 T. Due to the anisotropy of the rare-earth ions, it is feasible to orient the single-crystalline particles in higher degrees even by means of the application of such a low magnetic field as 1.4 T.

A means for generating an electric field at the forming step can be selected arbitrarily in compliance with a strength of the magnetic field to be applied. Although it is even advisable to use a superconductive magnet or permanent magnet, it is desirable to use an electromagnet because a uniform and broad magnetic-field space is available therefrom.

A specific method of the electric-field application can be determined according to a direction of the axis of easy magnetization in the single-crystalline particles to which a rare-earth element is added. Specifically, a static magnetic field can be applied in a case where the axis of easy magnetization is the c axis in the single-crystalline particles to which a rare-earth element is added, whereas a rotary magnetic field whose axis is taken in the vertical direction can be applied in a case where the axis of easy magnetization is the a axis in the single-crystalline particles to which a rare-earth element is added.

In a case where a rotary magnetic field is applied, it is preferable that a rotary speed of the magnetic field can be 0.1 rpm-100 rpm. In a case where the rotary speed is less than 0.1 rpm, there is such a fear that the orientation of the single-crystalline particles might decline, whereas the orientation might decline being accompanied by decline in the dispersibility that results from the centrifugal force in a case where it exceeds 100 rpm.

Specifically speaking, in the single-crystalline particles comprising an apatite-system compound to which cerium (Ce), praseodymium (Pr), neodymium (Nd), terbium (Tb), dysprosium (Dy) or holmium (Ho) is added as a rare-earth element, for example, in Nd:FAP ($Ca_5(PO_4)_3F$), the axis of easy magnetization becomes the c axis. In other words, the anisotropy of magnetic susceptibility becomes $\chi_a < \chi_c$. Consequently, in a case of the single-crystalline particles comprising an apatite-system compound to which Ce, Pr, Nd, Tb, Dy or Ho is added, a uniaxial orientation is obtainable by applying a static magnetic field in an arbitrary direction, because a magnetic torque occurs in such a direction that the c axis becomes parallel to the direction of magnetic-field application as illustrated in FIG. 1(a). By means of this, it is possible to obtain a formed body in which crystal directions of the respective single-crystalline particles are aligned uniaxially.

Similarly, in the single-crystalline particles comprising a vanadate-system compound to which promethium (Pm), samarium (Sm), erbium (Eb), thulium (Tm) or ytterbium (Yb) is added as a rare-earth element, the axis of easy magnetization becomes the c axis, and hence the anisotropy of magnetic susceptibility becomes $\chi_a < \chi_c$. Consequently, in a case of the single-crystalline particles comprising a vanadate-system compound to which Pm, Sm, Er, Tm or Yb is added, a uniaxial orientation is obtainable by applying a static magnetic field in an arbitrary direction, because a magnetic torque occurs in such a direction that the c axis becomes parallel to the direction of magnetic-field application. By means of this, it is possible to obtain a formed body in which crystal directions of the respective single-crystalline particles are aligned uniaxially.

On the other hand, in the single-crystalline particles comprising an apatite-system compound to which Pm, Sm, Er, Tm or Yb is added as a rare-earth element (namely, in Yb:FAP ($Ca_5(PO_4)_3F$), for instance), the axis of easy magnetization becomes the a axis. In other words, the anisotropy of magnetic susceptibility becomes $\chi_c < \chi_a$. Consequently, in a case of the single-crystalline particles comprising an apatite-system compound to which Pm, Sm, Er, Tm or Yb is added, the a axis orients parallel to the direction of magnetic-field application. On this occasion, the c axis can be directed in an arbitrary direction as illustrated in FIG. 1(b), because of not receiving any toque within the plane that is perpendicular to a magnetic-field application. Consequently, it is possible to obtain a formed body in which the c axis is oriented uniaxially by means of applying a rotary magnetic field in which a direction being perpendicular to the direction of magnetic-field application makes the rotary-axis direction. To put it differently, it is possible to obtain a formed body in which crystal directions of the respective single-crystalline particles are aligned uniaxially.

Similarly, in the single-crystalline particles comprising a vanadate-system compound to which Ce, Pr, Nd, Tb, Dy or Ho is added as a rare-earth element, the axis of easy magnetization becomes the a axis, and hence the anisotropy of magnetic susceptibility becomes $\chi_c < \chi_a$. Consequently, in a case of the single-crystalline particles comprising a vanadate-system compound to which Ce, Pr, Nd, Tb, Dy or Ho is added, it is possible to obtain a formed body in which the c axis is oriented uniaxially by means of applying a rotary magnetic field in which a direction being perpendicular to the direction of magnetic-field application makes the rotary-axis direction, because the a axis orients parallel to the direction of magnetic-field application and the c axis can be directed in an arbitrary direction.

Note that such relationships between the magnetic characteristics and the methods of magnetic-field application are identical even in any one of hexagonal, trigonal or tetragonal. That is, even in a case where the crystalline structure of the single-crystalline particles is any one of hexagonal, trigonal or tetragonal, it is possible to obtain a formed body in which crystal directions of the respective single-crystalline particles are aligned uniaxially by means of employing a predetermined method of magnetic-field application in compliance with the direction of the axis of easy magnetization in the single-crystalline particles to which a rare-earth element is added.

Figure 2:
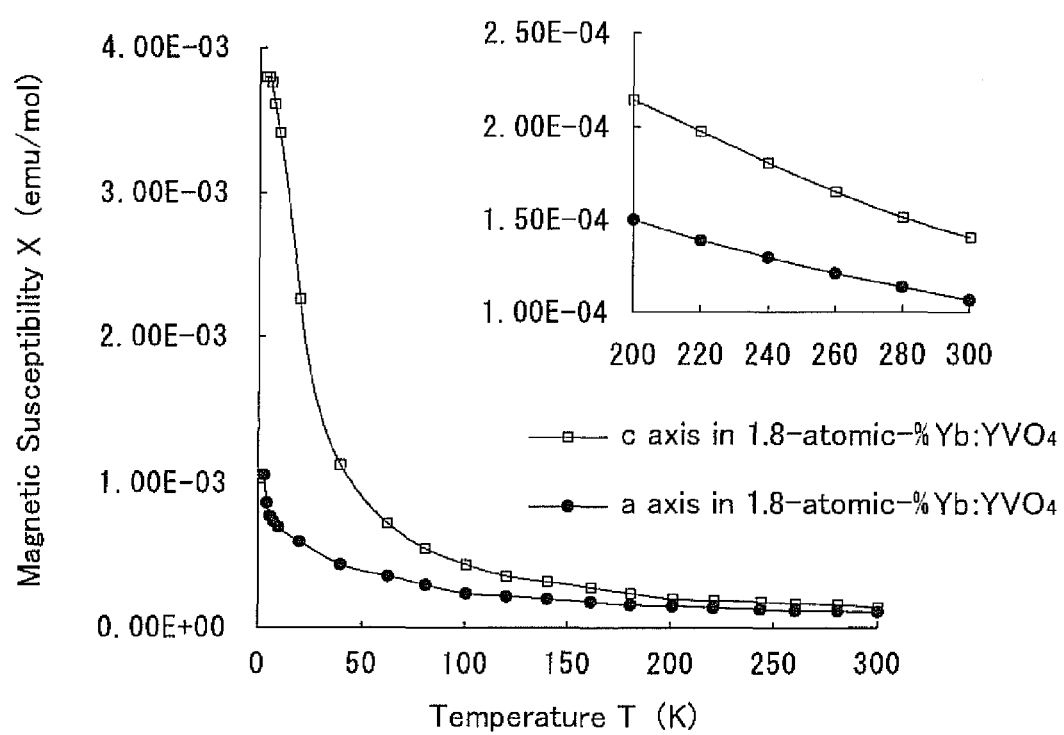
FIG. 2 is a graph for illustrating temperature dependencies of the magnetic anisotropy of single-crystalline particles to which a rare-earth element is added in a production process for transparent polycrystalline material according to some of the present embodiment modes.

Here, the axis of easy magnetization in the single-crystalline particles depends on the crystalline structures, the ionic species of added rare-earth elements and the crystal temperature. For example, the temperature dependency of the magnetic anisotropy of a $YVO_4$ single crystal to which Yb is added in an amount of 1.8 atomic % is illustrated in FIG. 2. Note that, in FIG. 2, the symbols □ show the magnetic susceptibilities in the c-axis direction in the 1.8 atomic % Yb:$YVO_4$ single crystal, and the symbols ● show the magnetic susceptibilities in the a-axis direction in the 1.8 atomic % Yb:$YVO_4$ single crystal.

As can be apparent from FIG. 2, it is understood that the lower the crystal temperature is the greater the effect of inducing magnetic anisotropy resulting from the rare-earth ion is. In a case of the 1.8 atomic % Yb:$YVO_4$, the magnitude of magnetic anisotropy becomes 1.85 times by means of lowering the crystal temperature from 300 K to 200K, for instance. Lowering the crystal temperature like this by cooling the suspension liquid at the forming step has an equivalent effect to that of increasing the strength of magnetic-field application. On the other hand, when the crystal temperature of the single-crystalline particles is too high at the forming step, the effect of inducing magnetic anisotropy resulting from the rare-earth ion becomes smaller, and so the magnetic anisotropy becomes smaller in the single-crystalline particles, and hence the strength of magnetic-field application that is needed for controlling the orientation of crystal has become higher, or controlling the orientation of crystal per se has become difficult or impossible. Therefore, it is necessary to do a temperature control at the forming step so that the single-crystalline particles to which a rare-earth element is added demonstrate a predetermined magnetic anisotropy. From such viewpoints, it is preferable to do a temperature control at the forming step so that the crystal temperature of the single-crystalline particles becomes 300 K or less, and it is more preferable to do a temperature control thereat so that the crystal temperature of the single-crystalline particles becomes 273 K or less.

When the suspension liquid is subjected to a temperature control at the forming step so that the single-crystalline particles comprising an apatite-system compound or vanadate-system compound to which a rare-earth element is added becomes capable of orienting in a magnetic field, it is possible to uniaxially orient the crystal direction in higher degree with such a strength of magnetic-field application as 1 T-1.4 T. Note that the lower the crystal temperature of the single-crystalline particles is at the forming step the greater the effect of inducing magnetic anisotropy resulting from the rare-earth ion becomes, and so preferable it is because it is possible to lower the strength of magnetic-field application that is needed for controlling the orientation of crystal. However, from the viewpoints of the dispersibility and formability of particles in low-temperature environments, it is preferable to set the lower limit of the crystal temperature of the single-crystalline particles at 180 K in the forming step.

At the calcination step, said formed body is calcined, thereby obtaining a transparent polycrystalline material comprising a transparent polycrystalline body that has a polycrystalline structure whose crystal orientation is controlled. That is, in the thus obtained transparent polycrystalline material, crystal directions of the respective single-crystalline particles that constitute the polycrystalline structure become one which is aligned uniaxially. In the calcination step, it is possible to obtain transparent polycrystalline materials that have higher orientations without ever applying any magnetic field.

At the calcination step, a primary sintering step, and a secondary sintering step are executed in this order.

Figure 3:
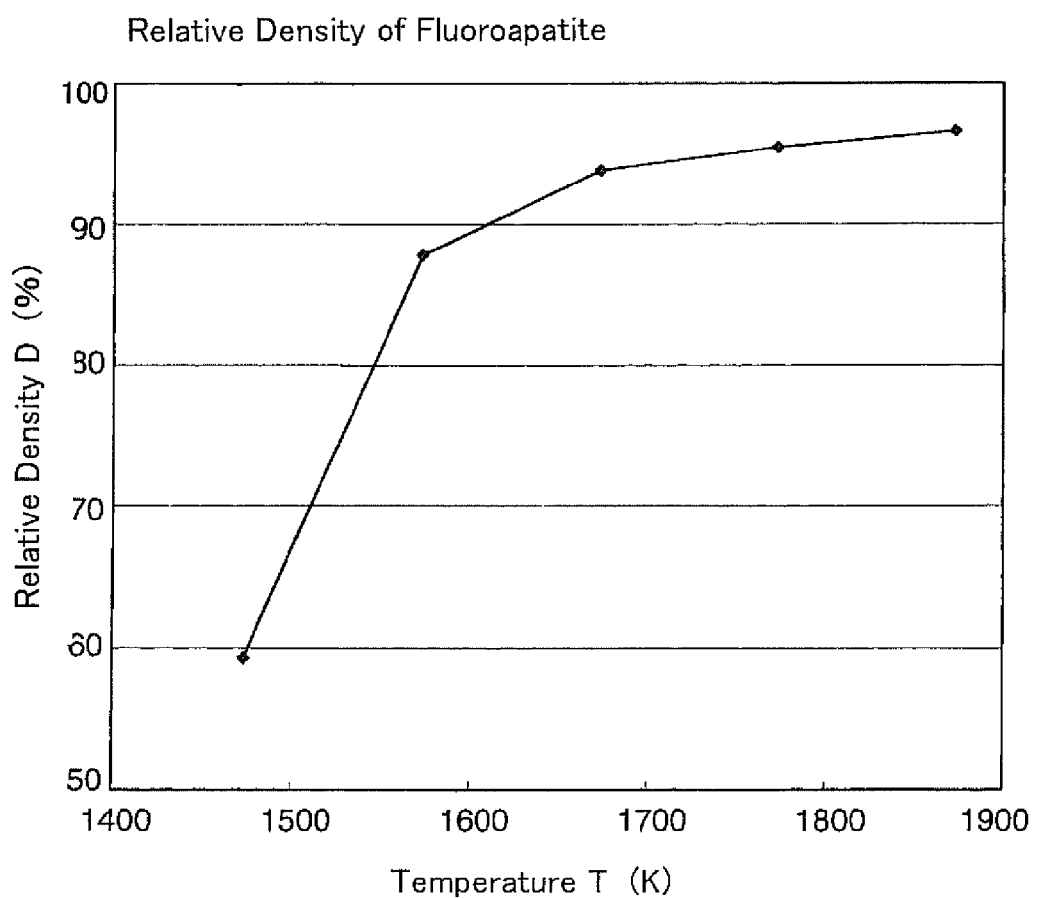
FIG. 3 is a graph for illustrating the sintering-temperature dependency of the relative density of fluoroapatite in a production process for transparent polycrystalline material according to one of the present embodiment modes.

At the primary calcination step, said formed body is sintered primarily at a temperature of 1,600-1,900 K, thereby obtaining a primarily-sintered body. It is advisable that the primarily-sintering temperature can be 1,700-1,900 K. In FIG. 3, the relative densities of fluoroapatite sintered body (e.g., $Ca_5(PO_4)_3F_2$) are shown. A "relative density" refers to a ratio of a density of an actual sample with respect to another density (or the theoretical density) thereof when pores are zero in the sample.

This relative density of sintered body saturates by such a treatment at 1,600 K or more, or at 1,700 K or more preferably. Hence, when the processing temperature is lower than 1,600 K in the primary sintering step, the transparency of polycrystalline material being obtained at the secondary sintering step declines, because the densification becomes insufficient in the primary sintering stage. On the other hand, when the primarily-sintering temperature is higher than 1,900 K, the mechanical strength of polycrystalline material being obtained at the secondary sintering step declines, because the crystal grains coarsen due to abnormal grain growth. Although the atmosphere, time and pressure in this primary sintering step are not limited especially, it is possible to set up such ordinary-pressure sintering that is done in an atmosphere of air for a primary sintering time of 0.5-3 hours approximately, for instance.

At the secondary sintering step, the primarily-sintered body is subjected to hot isostatic press sintering at a temperature of 1,600-1,900 K. It is advisable that the sintering temperature can be 1,700-1,900 K in the secondary sintering. In a case where the secondarily-sintering temperature is less than 1,700 K, namely, the lower limit of the primarily-sintering temperature, or further in a case where it is less than 1,600 K, in the secondary sintering step, the transparency of obtainable polycrystalline material declines, because the densification resulting from the hot isostatic pressing does not become optimized. On the other hand, when the secondarily-sintering temperature is higher than 1,900 K, the mechanical strength of obtainable polycrystalline material declines, because the crystal grains coarsen. Although the atmosphere, time and pressure in this secondary sintering step are not limited especially, it is possible to set them up as follows: in an atmosphere of argon, for a secondary sintering time of 0.5-1 hour approximately, and with a secondary sintering pressure of 100-200 MPa approximately, for instance.

The thus produced transparent polycrystalline material that is directed to the present embodiment mode comprises a transparent polycrystalline body being obtained by forming and then sintering a plurality of single-crystalline particles that include a rare-earth element, and which are anisotropic optically, and has a polycrystalline structure in which crystal directions of the respective single-crystalline particles are aligned uniaxially.

Here, the "transparency" in transparent polycrystalline material means that light propagates in polycrystalline body without ever being absorbed or scattered, namely, being transparent optically. More concretely speaking, it means that the linear transmissivity can be 50% or more (or can preferably be 70% or more) under such conditions for measuring transmissivity that the thickness of the polycrystalline body is 0.8 mm and the wavelength of light is 1,000 nm. The "linear transmissivity" indicates the transmissivity of light in the thickness-wise direction of the transparent polycrystalline material.

EXAMPLES

The present invention will be explained in more detail by means of the following examples. Note that the present invention is not one which is limited by means of the examples below.

Example 1

In Example No. 1, an Nd:FAP ceramic serving as a transparent polycrystalline material was produced using Nd as a rare-earth element and fluoroapatite (or FAP) that was expressed by a chemical formula, $Ca_5(PO_4)_3F$, as anisotropic single-crystalline particles, respectively.

<Preparation Step>

4-atomic-% Nd:FAP single-crystalline body being produced by means of wet way was pulverized in a mortar, thereby turning it into 4-atomic-% Nd:FAP single-crystalline particles with an average particle diameter of about 0.2 μm. A slurry 1 comprising a 4-atomic-% Nd:FAP suspension liquid was prepared by means of adding 3-mL water and 1-mL dispersion agent ("ACUARIC" produced by NIHON SHOKUBAI) to 3 g of the resulting 4-atomic-% Nd:FAP single-crystalline particles.

<Forming Step>

Figure 4:
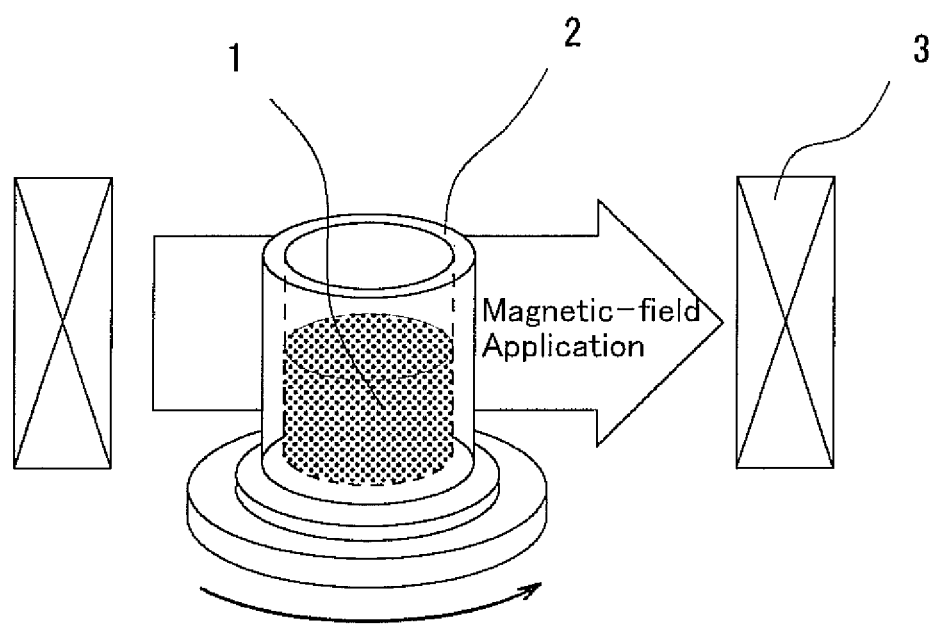
FIG. 4 is a diagram for explaining a production process for transparent polycrystalline material according to one of the present embodiment modes schematically.

As illustrated in FIG. 4, the slurry 1 was poured into a gypsum mold 2, was then dewatered at a temperature of 296 K while applying a magnetic field with 1.4 T thereto in the horizontal direction using an electromagnet 3, and was thereby subjected to molding.

Here, since the axis of easy magnetization was the c axis in the 4-atomic-% Nd:FAP single-crystalline bodies, a magnetic torque occurred in the 4-atomic-% Nd:FAP single-crystalline bodies in such a direction that the c axis became parallel to the direction of magnetic-field application. Consequently, the c axes of the 4-atomic-% Nd:FAP single-crystalline bodies were oriented uniaxially in such a direction that was parallel to the direction of magnetic-field application by means of applying a horizontally-directed static magnetic field to the slurry 1, without ever rotating the gypsum mold 2.

A cylindrical formed body with 7-mm diameter and 10-mm thickness was obtained by doing natural drying thereafter at room temperature for 72 hours.

<Calcination Step>

Primary sintering was carried out by means of sintering the obtained formed body in an air atmosphere under such conditions that the heating temperature was 1,873 K and the heating time was 1 hour. A relative density of the obtained primarily-sintered body was 90% or more.

Moreover, secondary sintering was carried out by performing capsule-free HIP processing (or Hot Isostatic Pressing (e.g., hot isostatic press molding)) with respect to the obtained primarily-sintered body in an argon atmosphere under such conditions that the heating temperature was 1,873 K, the heating time was 1 hour and the pressure was 196 MPa, thereby producing an Nd:FAP ceramic according to Example No. 1.

When the Nd:FAP ceramic obtained in Example No. 1 was molded to a diameter of 7 mm and a thickness of 0.8 mm in order to measure the linear transmissivity for light with a wavelength of 1,000 nm, it was found to be 77%, thereby showing transparency.

Example No. 2

In the present example, a Yb:FAP ceramic serving as a transparent polycrystalline material was produced using Yb as a rare-earth element and FAP that was expressed by a chemical formula, $Ca_5(PO_4)_3F$, as anisotropic single-crystalline particles, respectively.

<Preparation Step>

4-atomic-% Yb:FAP single-crystalline body being produced by means of wet way was pulverized in a mortar, thereby turning it into 4-atomic-% Yb:FAP single-crystalline particles with an average particle diameter of about 0.2 μm. A slurry 1 comprising a 4-atomic-% Yb:FAP suspension liquid (or slurry) was prepared by means of adding 3-mL water and 1-mL dispersion agent ("ACUARIC" produced by NIHON SHOKUBAI) to 3 g of the resulting 4-atomic-% Yb:FAP single-crystalline particles.

<Forming Step>

As illustrated in FIG. 4, the slurry 1 was poured into a gypsum mold 2, was then dewatered at a temperature of 296 K in the direction of gravitational force while applying a magnetic field with 1.4 T thereto in the horizontal direction using an electromagnet 3, and was thereby subjected to molding.

Here, since the axis of easy magnetization was the a axis in the 4-atomic-% Yb:FAP single-crystalline bodies, a magnetic torque occurred in the 4-atomic-% Yb:FAP single-bodies particles in such a direction that the a axis became parallel to the direction of magnetic-field application. On this occasion, since the c axes of the 4-atomic-% Yb:FAP single-crystalline bodies did not receive any magnetic torque in the plane that was perpendicular to the magnetic field, the c axes of the 4-atomic-% Yb:FAP single-crystalline bodies could be directed in any direction. Consequently, at the forming step in Example No. 2, the gypsum mold 2 was rotated at 17 rpm about a rotary axis that was taken in the vertical direction, namely, in the perpendicular direction to the direction of magnetic-field application, in order to apply a horizontally-directed rotary magnetic field to the slurry 1, thereby orienting the c axes of the 4-atomic-% Yb:FAP single-crystalline bodies uniaxially in such a direction that was parallel to the direction of the rotary axis.

A cylindrical formed body with 7-mm diameter and 10-mm thickness was obtained by doing natural drying thereafter at room temperature for 72 hours.

<Calcination Step>

A Yb:FAP ceramic according to Example No. 2 was obtained by not only primarily sintering the obtained formed body but also performing the HIP processing thereto in the same manner as Example No. 1.

This Yb:FAP ceramic obtained in Example No. 2 was transparent optically, and showed transparency that was equivalent to that of Example No. 1.

Example No. 3

Except that the heating temperature was varied to 1,773 K during the primary sintering in the calcination step according to Example No. 1, an Nd:FAP ceramic according to Example No. 3 was produced in the same manner as Example No. 1. Note that a relative density of the primarily-sintered body that was obtained by the primary sintering in the calcination step according to Example No. 3 was 90% or more.

This Nd:FAP ceramic obtained in Example No. 3 was transparent optically, and showed transparency that was equivalent to that of Example No. 1.

Example No. 4

Except that the heating temperature was varied to 1,773 K during the primary sintering in the calcination step according to Example No. 2, a Yb:FAP ceramic according to Example No. 4 was produced in the same manner as Example No. 2. Note that a relative density of the primarily-sintered body that was obtained by the primary sintering in the calcination step according to Example No. 4 was 90% or more.

This Yb:FAP ceramic obtained in Example No. 4 was transparent optically, and showed transparency that was equivalent to that of Example No. 1.

Example No. 5

Except that the pressure was set at $1\times10^{-4}$ Pa and the heating temperature was varied to 1,643 K during the primary sintering in the calcination step according to Example No. 1, an Nd:FAP ceramic according to Example No. 5 was produced in the same manner as Example No. 1. Note that a relative density of the primarily-sintered body that was obtained by the primary sintering in the calcination step according to Example No. 5 was 90% or more.

This Nd:FAP ceramic obtained in Example No. 5 was transparent optically, and showed transparency that was equivalent to that of Example No. 1.

Comparative Example No. 1

Except that the heating temperature was varied to 1,573 K during the primary sintering in the calcination step according to Example No. 1, an Nd:FAP ceramic according to Comparative Example No. 1 was produced in the same manner as Example No. 1. Note that a relative density of the primarily-sintered body that was obtained by the primary sintering in the calcination step according to Comparative Example No. 1 was 90% or less.

This Nd:FAP ceramic obtained in Comparative Example No. 1 was not transparent optically, and did not show any transparency.

Comparative Example No. 2

Except that the heating temperature was varied to 1,573 K during the primary sintering in the calcination step according to Example No. 2, a Yb:FAP ceramic according to Comparative Example No. 2 was produced in the same manner as Example No. 2. Note that a relative density of the primarily-sintered body that was obtained by the primary sintering in the calcination step according to Comparative Example No. 2 was 90% or less.

This Yb:FAP ceramic obtained in Comparative Example No. 2 was not transparent optically, and did not show any transparency.

Comparative Example No. 3

Except that the heating temperature was varied to 1,273 K during the secondary sintering (or the HIP processing) in the calcination step according to Example No. 1, an Nd:FAP ceramic according to Comparative Example No. 3 was produced in the same manner as Example No. 1.

This Nd:FAP ceramic obtained in Comparative Example No. 3 was not transparent optically, and did not show any transparency.

Comparative Example No. 4

Except that the heating temperature was varied to 1,273 K during the secondary sintering (or the HIP processing) in the calcination step according to Example No. 2, a Yb:FAP ceramic according to Comparative Example No. 4 was produced in the same manner as Example No. 2.

This Yb:FAP ceramic obtained in Comparative Example No. 4 was not transparent optically, and did not show any transparency.

(Evaluation of Crystal Orientation)

For the sample of Nd:FAP ceramic obtained in Example No. 1, and for the sample of Yb:FAP ceramic obtained in Example No. 2, the evaluation of crystal orientation was carried out using an X-ray diffraction apparatus ("RINT2035" produced by RIGAKU Co., Ltd.).

Figure 5:
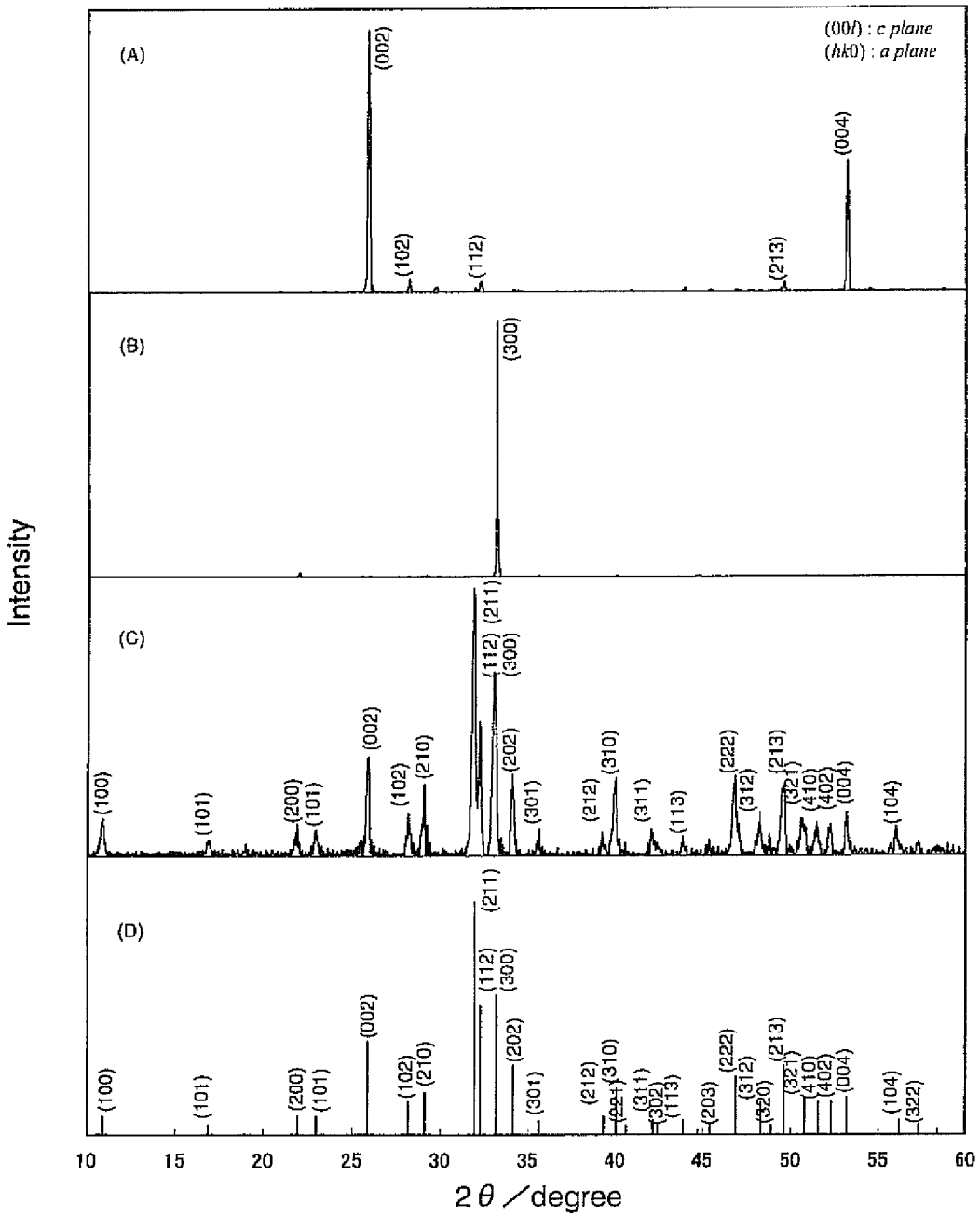
FIG. 5 is a diagram for illustrating the results of doing X-ray diffraction regarding Nd:FAP ceramic that was obtained in Example No. 1, and regarding Yb:FAP ceramic that was obtained in Example No. 2.

Those results are illustrated in FIG. 5. Note that, in FIG. 5, the symbols, (A), (B), (C) and (D), show the evaluation results on the Nd:FAP ceramic obtained in Example No. 1, the evaluation results on the Yb:FAP ceramic obtained in Example No. 2, the evaluation results on a powder of the FAP single-crystalline body to which any rare-earth element was not added, and the data of JCPDS cards on the powder of FAP single-crystalline body to which any rare-earth element was not added, respectively.

According to the results illustrated in FIG. 5, it was ascertained that, regarding the Nd:FAP ceramic obtained in Example No. 1 labeled (A), it underwent the c-axis orientation, because the relative strength of the (001) plane rose. Moreover, regarding the Yb:FAP ceramic obtained in Example No. 2 labeled (B), a crystal orientation in which the a axis made the axis of easy magnetization was observed, because the relative strength of the (hk0) plane rose.

Therefore, it was ascertained that it is feasible to give highly uniaxial orientations, which are needed as laser media, by means of the application of magnetic field with 1.4 T.

Hence, it was verified that is feasible to make laser ceramic media that use anisotropic crystals.

Other Examples

Note that, in aforesaid Example Nos. 1, 3 and 5, the explanations were made on examples in which Nd:FAP ceramics, which served as transparent polycrystalline materials, were produced by using Nd and fluoroapatite (or FAP) that was expressed by a chemical formula, $Ca_5(PO_4)_3F$, as a rare-earth element and anisotropic single-crystalline particles, respectively, and then applying a static magnetic field thereto at the forming step. However, it is even allowable in Example Nos. 1, 3 and 5 to use Ce, Pr, Tb, Dy or Ho as the rare-earth element, instead of Nd. Moreover, as the anisotropic single-crystalline particles, it is also permissible to even use $Sr_5(PO_4)_3F$, $Sr_5(VO_4)_3F$, $Ca_5(VO_4)_3F$, $Ca_5(PO_4)_3OH$, $Sr_5(PO_4)_3OH$, $Sr_5(VO_4)_3OH$ or $Ca_5(VO_4)_3OH$ as the anisotropic single-crystalline particles, instead of the fluoroapatite (or FAP) that is expressed by the chemical formula, $Ca_5(PO_4)_3F$. In these cases as well, it is possible to produce transparent polycrystalline materials by applying a static magnetic field thereto in the same manner as Example Nos. 1, 3 and 5.

Likewise, in aforesaid Example Nos. 1, 3 and 5, it is even advisable to use Pm, Sm, Er, Tm or Yb as the rare-earth element, instead of Nd; and simultaneously therewith to use yttrium orthovanadate that is expressed by a chemical formula, $YVO_4$, gadolinium orthovanadate that is expressed by a chemical formula, $GdVO_4$, or lutetium orthovanadate that is expressed by a chemical formula, $LuVO_4$, as the anisotropic single-crystalline particles, instead of the fluoroapatite that is expressed by the chemical formula, $Ca_5(PO_4)_3F$. In these cases as well, it is possible to produce transparent polycrystalline materials by applying a static magnetic field thereto in the same manner as Example Nos. 1, 3 and 5.

Moreover, in aforesaid Example Nos. 2 and 4, the explanations were made on examples in which Yb:FAP ceramics, which served as transparent polycrystalline materials, were produced by using Yb and fluoroapatite (or FAP) that was expressed by a chemical formula, $Ca_5(PO_4)_3F$, as a rare-earth element and anisotropic single-crystalline particles, respectively, and then applying a rotary magnetic field thereto at the forming step. However, it is even advisable in Example Nos. 2 and 4 to use Pm, Sm, Er or Tm as the rare-earth element, instead of Yb; and simultaneously therewith to use $Sr_5(PO_4)_3F$, $Sr_5(VO_4)_3F$, $Ca_5(VO_4)_3F$, $Ca_5(PO_4)_3OH$, $Sr_5(PO_4)_3OH$, $Sr_5(VO_4)_3OH$ or $Ca_5(VO_4)_3OH$ as the anisotropic single-crystalline particles, instead of the fluoroapatite (or FAP) that is expressed by the chemical formula, $Ca_5(PO_4)_3F$. In these cases as well, it is possible to produce transparent polycrystalline materials by applying a rotary magnetic field thereto in the same manner as Example Nos. 2 and 4.

Likewise, in aforesaid Example Nos. 2 and 4, it is even advisable to use Ce, Pr, Nd, Tb, Dy or Ho as the rare-earth element, instead of Yb; and simultaneously therewith to use yttrium orthovanadate that is expressed by a chemical formula, $YVO_4$, gadolinium orthovanadate that is expressed by a chemical formula, $GdVO_4$, or lutetium orthovanadate that is expressed by a chemical formula, $LuVO_4$, as the anisotropic single-crystalline particles, instead of the fluoroapatite that is expressed by the chemical formula, $Ca_5(PO_4)_3F$. In these cases as well, it is possible to produce transparent polycrystalline materials by applying a rotary magnetic thereto in the same manner as Example Nos. 2 and 4.

INDUSTRIAL APPLICABILITY

The transparent polycrystalline materials that are directed to the present embodiment modes can preferably be used for an optical material. As for this optical material, it is possible to name laser media, optical substrates, windows, lenses, prisms, beam splitters, and waveguides such as fibers or slabs, for instance. Of these optical materials, the laser media are preferable especially.

The invention claimed is:

1. A production process for transparent polycrystalline material is characterized in that:
   it is equipped with:
      a preparation step of preparing a suspension liquid by dispersing a raw-material powder in a solution, the raw-material powder including single-crystalline particles to which a rare-earth element is added and which are anisotropic optically;
      a forming step of obtaining a formed body from said suspension liquid by means of carrying out slip casting in a space with a magnetic field applied; and
      a calcination step of obtaining a transparent polycrystalline material by sintering said formed body, the transparent polycrystalline material comprising a transparent polycrystalline body that has a polycrystalline structure whose crystal orientation is controlled,
   wherein, at said forming step, the magnetic field is one of a static magnetic field and a rotary magnetic field which is selected in compliance with a direction of an axis of easy magnetization in said single-crystalline particles, and the magnetic field is then applied to said single-crystalline particles while doing a temperature control so that the single-crystalline particles demonstrate predetermined magnetic anisotropy,
   wherein, at said calcination step, a primary sintering step of obtaining a primarily-sintered body by primarily sintering said formed body at a temperature of 1,600-1,900 K, and a secondary sintering step of hot-isotropic-press sintering the primarily sintered body at a temperature of 1,600-1,900 K are executed in this order, and
   wherein said single-crystalline particles comprise an apatite-system compound or a vanadate-system compound.

2. The production process for transparent polycrystalline material as set forth in claim 1, wherein said apatite-system compound is fluoroapatite, hydroxyapatite or vanadate apatite that is expressed by a chemical formula, $\alpha_5(\beta O_4)_3\gamma$ ($\alpha$: Ca or Sr, $\beta$: P or V, and $\gamma$: OH or F).

3. The production process for transparent polycrystalline material as set forth in claim 1, wherein said vanadate-system compound is at least one member that is selected from the group consisting of yttrium orthovanadate that is expressed by a chemical formula, $YVO_4$; gadolinium orthovanadate that is expressed by a chemical formula, $GdVO_4$; and lutetium orthovanadate that is expressed by a chemical formula, $LuVO_4$.

4. The production process for transparent polycrystalline material as set forth in claim 1, wherein the apatite-system compound is at least one member that is selected from the group consisting of $Ca_5(PO_4)_3F$, $Sr_5(PO_4)_3F$, $Sr_5(VO_4)_3F$, $Ca_5(VO_4)_3F$, $Ca_5(PO_4)_3OH$, $Sr_5(PO_4)_3OH$, $Sr_5(VO_4)_3OH$, and $Ca_5(VO_4)_3OH$.

5. A production process for transparent polycrystalline material is characterized in that:
   it is equipped with:
      a preparation step of preparing a suspension liquid by dispersing a raw-material powder in a solution, the raw-material powder including single-crystalline particles to which a rare-earth element is added and which are anisotropic optically;
      a forming step of obtaining a formed body from said suspension liquid by means of carrying out slip casting in a space with a magnetic field applied; and
      a calcination step of obtaining a transparent polycrystalline material by sintering said formed body, the transparent polycrystalline material comprising a transparent polycrystalline body that has a polycrystalline structure whose crystal orientation is controlled,
   wherein, at said forming step, the magnetic field is a static magnetic field, and the magnetic field is then applied to said single-crystalline particles while doing a temperature control so that the single-crystalline particles demonstrate predetermined magnetic anisotropy,
   wherein, at said calcination step, a primary sintering step of obtaining a primarily-sintered body by primarily sintering said formed body at a temperature of 1,600-1,900K, and a secondary sintering step of hot-isotropic-press sintering the primarily sintered body at a temperature of 1,600-1,900 K are executed in this order, and
   wherein the axis of easy magnetization is the c axis in said single-crystalline particles.

6. The production process for transparent polycrystalline material as set forth in claim 5, wherein:
   the static magnetic field is applied at said forming step,
   said single-crystalline particles comprise an apatite-system compound, and
   said rare-earth element is at least one member that is selected from the group consisting of cerium (Ce), praseodymium (Pr), neodymium (Nd), terbium (Tb), dysprosium (Dy), and holmium (Ho).

7. The production process for transparent polycrystalline material as set forth in claim 5, wherein:
   the static magnetic field is applied at said forming step,
   said single-crystalline particles comprise a vanadate-system compound, and
   said rare-earth element is at least one member that is selected from the group consisting of promethium (Pm), samarium (Sm), erbium (Er), thulium (Tm), and ytterbium (Yb).

8. A production process for transparent polycrystalline material is characterized in that:
   it is equipped with:
      a preparation step of preparing a suspension liquid by dispersing a raw-material powder in a solution, the raw-material powder including single-crystalline particles to which a rare-earth element is added and which are anisotropic optically;
      a forming step of obtaining a formed body from said suspension liquid by means of carrying out slip casting in a space with a magnetic field applied; and a calcination step of obtaining a transparent polycrystalline material by sintering said formed body, the transparent polycrystalline material comprising a transparent polycrystalline body that has a polycrystalline structure whose crystal orientation is controlled, wherein, at said forming step, the magnetic field is a rotary magnetic field, and the magnetic field is then applied to said single-crystalline particles while doing a temperature control so that the single-crystalline particles demonstrate predetermined magnetic anisotropy, wherein, at said calcination step, a primary sintering step of obtaining a primarily-sintered body by primarily sintering said formed body at a temperature of 1,600-1,900 K, and a secondary sintering step of hot-isotropic-press sintering the primarily sintered body at a temperature of 1,600-1,900 K are executed in this order, and wherein the axis of easy magnetization is the a axis in said single-crystalline particles.

9. The production process for transparent polycrystalline material as set forth in claim 8, wherein:

the rotary magnetic field is applied at said forming step, said single-crystalline particles comprise an apatite-system compound, and said rare-earth element is at least one member that is selected from the group consisting of promethium (Pm), samarium (Sm), erbium (Er), thulium (Tm), and ytterbium (Yb).

10. The production process for transparent polycrystalline material as set forth in claim 8, wherein:

the rotary magnetic field is applied at said forming step, said single-crystalline particles comprise a vanadate-system compound, and said rare-earth element is at least one member that is selected from the group consisting of cerium (Ce), praseodymium (Pr), neodymium (Nd), terbium (Tb), dysprosium (Dy), and holmium (Ho).

* * * * *